United States Patent
Al-Sa'di et al.

(10) Patent No.: US 10,431,666 B2
(45) Date of Patent: Oct. 1, 2019

(54) METHOD OF MAKING A SEMICONDUCTOR SWITCH DEVICE

(71) Applicant: NXP B.V., Eindhoven (NL)

(72) Inventors: Mahmoud Shehab Mohammad Al-Sa'di, Kranenburg (DE); Petrus Hubertus Cornelis Magnee, Malden (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/935,306

(22) Filed: Mar. 26, 2018

(65) Prior Publication Data

US 2018/0337250 A1    Nov. 22, 2018

(30) Foreign Application Priority Data

May 17, 2017   (EP) .................................... 17171514

(51) Int. Cl.

| | |
|---|---|
| *H01L 29/66* | (2006.01) |
| *H01L 21/266* | (2006.01) |
| *H01L 21/265* | (2006.01) |
| *H01L 29/08* | (2006.01) |
| *H01L 29/10* | (2006.01) |
| *H01L 29/423* | (2006.01) |
| *H01L 29/36* | (2006.01) |

(Continued)

(52) U.S. Cl.
CPC ........ *H01L 29/6659* (2013.01); *H01L 21/266* (2013.01); *H01L 21/26513* (2013.01);

(Continued)

(58) Field of Classification Search
CPC ................. H01L 29/6659; H01L 29/36; H01L 21/823493; H01L 29/7835; H01L 29/167;

(Continued)

(56) References Cited

U.S. PATENT DOCUMENTS

| 4,306,916 A | 12/1981 | Wollesen et al. |
|---|---|---|
| 6,903,421 B1 | 6/2005 | Huang et al. |

(Continued)

OTHER PUBLICATIONS

Kim, H.W. et al; "Linearly-graded surface-doped SOI LDMOSFET with recessed source"; Microelectronic Engineering, Elsevier Publishers B.V., Amsterdam, NL, vol. 51-52; pp. 547-554 (May 1, 2000).

(Continued)

*Primary Examiner* — Charles D Garber
*Assistant Examiner* — Alia Sabur

(57) ABSTRACT

A semiconductor switch device and a method of making the same. The method includes providing a semiconductor substrate having a major surface and a first semiconductor region having a first conductivity type. The method further includes implanting ions into the first semiconductor region through an opening in a mask positioned over the first semiconductor region, thereby to form a well region located in the first semiconductor region, the well region having a second conductivity type different to the first conductivity type. The method also includes depositing and patterning a gate electrode material on a gate dielectric to form a gate electrode located directly above the well region. The method further includes performing ion implantation to form a source region located in the well region on a first side of the gate, and to form a drain region located outside the well region on a second side of the gate.

12 Claims, 5 Drawing Sheets

(51) Int. Cl.
*H01L 29/78* (2006.01)
*H01L 29/167* (2006.01)

(52) U.S. Cl.
CPC ...... *H01L 29/0847* (2013.01); *H01L 29/1083* (2013.01); *H01L 29/42376* (2013.01); *H01L 29/6656* (2013.01); *H01L 29/66659* (2013.01); *H01L 29/7835* (2013.01); *H01L 29/167* (2013.01); *H01L 29/36* (2013.01)

(58) Field of Classification Search
CPC ......... H01L 29/66492; H01L 29/66537; H01L 29/66575–66583; H01L 29/66681–66704; H01L 21/265–266
See application file for complete search history.

(56) References Cited

U.S. PATENT DOCUMENTS

| | | |
|---|---|---|
| 8,003,455 B2 | 8/2011 | Cheng et al. |
| 2007/0020832 A1 | 1/2007 | Yang et al. |
| 2007/0111457 A1* | 5/2007 | You .................. H01L 21/823814 438/306 |
| 2013/0140632 A1 | 6/2013 | Landgraf et al. |
| 2013/0234249 A1* | 9/2013 | Zuniga ................ H01L 29/0634 257/343 |
| 2014/0253217 A1* | 9/2014 | Briere .................. H03K 17/162 327/382 |
| 2014/0346597 A1 | 11/2014 | Feilchenfeld et al. |
| 2015/0041894 A1 | 2/2015 | Herbert et al. |
| 2016/0087081 A1* | 3/2016 | You ................... H01L 29/66681 257/336 |
| 2017/0221994 A1 | 8/2017 | Al-Sa'di et al. |
| 2018/0053833 A1 | 2/2018 | Al-Sadi et al. |

OTHER PUBLICATIONS

U.S. Appl. No. 15/886265, filed Feb. 1, 2018.

* cited by examiner

METHOD OF MAKING A SEMICONDUCTOR SWITCH DEVICE

CROSS-REFERENCE TO RELATED APPLICATIONS

This application claims the priority under 35 U.S.C. § 119 of European patent application no. 17171514.7, filed May 17, 2017 the contents of which are incorporated by reference herein.

BACKGROUND

The present specification relates to method of making a semiconductor switch device and to a semiconductor switch device.

Metal Oxide Semiconductor Field Effect Transistors (MOSFETs) can be used as electric switches for high Radio Frequency (RF) signals. For these applications the device does not actually switch at high frequencies, rather it passes or blocks RF signals. Best performance is achieved with a device that combines low series resistance in on-state with low input capacitance in off-state. One of the most popular ways to evaluate the overall performance of an RF Switch MOSFET is to calculate a figure of merit (FOM), which is defined as the product of the on-state resistance (Ron) and the off-state capacitance ($C_{off}$).

Contributions to the off-state capacitance are the gate-to-source ($C_{gs}$), gate-to-drain ($C_{gd}$), gate-to-substrate ($C_{gb}$), drain-to-substrate ($C_{db}$), and source-to-substrate ($C_{sb}$) capacitance as shown in the following formulas:

$$C_{off} = \left(\frac{1}{C_{dd} - C_{ds}} + \frac{1}{C_{ss} - C_{ds}}\right)^{-1} + C_{ds} = \left(\frac{C_{dg} * C_{gs}}{C_{dg} + C_{gs}}\right) + \left(\frac{C_{db} * C_{sb}}{C_{db} + C_{sb}}\right) + C_{ds}$$

$$C_{ss} = C_{ds} + C_{gs} + C_{sb}$$

$$C_{dd} = C_{ds} + C_{gd} + C_{db}$$

Here, $C_{ds}$ is the channel capacitance, and $C_{sb}$, $C_{db}$ are the source to bulk, drain to bulk capacitances, respectively. The overlap capacitance ($C_{gs}=C_{gd}$) and parasitic junction capacitances ($C_{db}=C_{sb}$) are of great importance as they constitute both significant fractions of the total off-state capacitance ($C_{off}$). Therefore, to achieve low $C_{off}$ it is desirable to reduce the overlap capacitance and/or the parasitic junction capacitances.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the disclosure, there is provided a method of making a semiconductor switch device, the method comprising:

providing a semiconductor substrate having:
a major surface; and
a first semiconductor region having a first conductivity type located adjacent the major surface;
depositing a gate dielectric on the major surface of the substrate;

implanting ions into the first semiconductor region through an opening in a mask positioned over the first semiconductor region, thereby to form a well region located in the first semiconductor region, the well region having a second conductivity type different to the first conductivity type;

depositing and patterning a gate electrode material on the gate dielectric to form a gate electrode located directly above the well region; and performing ion implantation to:
form a source region having said first conductivity type located in the well region on a first side of the gate electrode, and
form a drain region having said first conductivity type located outside the well region on a second side of the gate electrode.

The use of the mask can prevent ions that are implanted to form the well region of the device from entering the parts of the first semiconductor region that will accommodate the drain region. This may selectively allow the drain-to-bulk parasitic junction capacitance ($C_{db}$) and, therefore, the off-state capacitance ($C_{off}$) of the device to be relatively low, owing to the reduced amount of impurity doping that occurs in the vicinity of the drain region. Note that the gate electrode of the device is located directly above the well region, whereby a channel region of the device is located in the well region.

The gate electrode may be located toward one side of the well region when viewed from above the major surface of the semiconductor substrate. The drain region may be located adjacent the side of the well region toward which the gate electrode is located. This can allow the drain region to be located outside the well region, yet adjacent the gate electrode (e.g. so that no part of the well region is located in-between the gate electrode and the drain region when viewed from above the major surface of the semiconductor substrate). In one example, an edge of the gate electrode located on the second side of the gate electrode may be located directly above an edge of the well region.

The ions implanted for forming the well region may comprise Boron ions.

An implantation energy of the implant for forming the well region may be in the range 50 keV-4 MeV.

A peak concentration of the implanted ions of the implant for forming the well region may be at a depth of around 0.1-2 µm beneath the major surface of the semiconductor substrate.

An implantation dose of the implant for forming the well region may be in the range $10^{11}$-$10^{14}$ cm$^{-2}$.

A lateral dimension of the opening in the mask may be substantially equal to $L_{source}+L_g+MTL$, where $L_{source}$ is a length of the source region measured from an edge of the gate electrode on the first side of the gate electrode, where $L_g$ is a gate length of the semiconductor switch device, where MTL is a mask tolerance of the opening, and where MTL≤400 nm. In some embodiments, the mask tolerance MTL may be in the range 0-200 nm. The gate length $L_g$ may be in the sub-micron range.

The method may further include implanting ions into the first semiconductor region through the opening in the mask positioned over the first semiconductor region, thereby to adjust a threshold voltage of the semiconductor switch device. The mask can thus prevent at least some of these ions from entering the parts of the first semiconductor region that will accommodate the drain region. This may again allow the drain-to-bulk parasitic junction capacitance of the device to remain relatively low, even when ions are implanted for adjusting the threshold voltage (sometimes referred to as a DVt implant).

The method may further include implanting ions into the first semiconductor region through the opening in the mask positioned over the first semiconductor region, thereby to inhibit punch-through in the semiconductor switch device. The mask can thus prevent at least some of these ions from entering the parts of the first semiconductor region that will accommodate the drain region. This may again allow the drain-to-bulk parasitic junction capacitance of the device to remain relatively low, even when ions are implanted to inhibit punch-through in the semiconductor switch device (sometimes referred to as an Anti-Punch-Through (APT) implant).

The method may include forming spacers on opposed sidewalls of the gate electrode prior to the performance of the ion implantation to form the source region and the drain region. The spacers may be formed on the sidewalls of the gate electrode after the use of the aforementioned mask, whereby the formation of the spacers need not interfere with the use of the mask or any of the various implants that may be carried out through the mask.

The first conductivity type may be n-type and the second conductivity type may be p-type. However, it is envisaged that the first conductivity type may be p-type and the second conductivity type may be n-type.

The first semiconductor region may be a doped epitaxial layer. The doped epitaxial layer may be provided as an upper layer on a Silicon-on-Insulator (SOI) substrate. In another example, the doped epitaxial layer may be provided on an underlying bulk semiconductor (e.g. silicon) substrate.

According to another aspect of the present disclosure, there may be provided a semiconductor switch device made using the method described above. The semiconductor switch device may be a Radio Frequency (RF) switch device.

A device of the kind described herein may be an RF switch device, for switching an RF signal. For the purposes of this disclosure "Radio Frequency" (RF) refers to frequencies typically in the range of, but not limited to 0.5 GHz≤f≤90 GHz. Note that although a semiconductor switch device according to embodiments of this disclosure may be used to pass or block an RF signal, typically the device would not actually switch at the RF frequency itself.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

FIGS. 1A-1D the various stages in a show a method for making a field effect transistor of a semiconductor switch device according to an embodiment of the present disclosure.

Figure 1A:
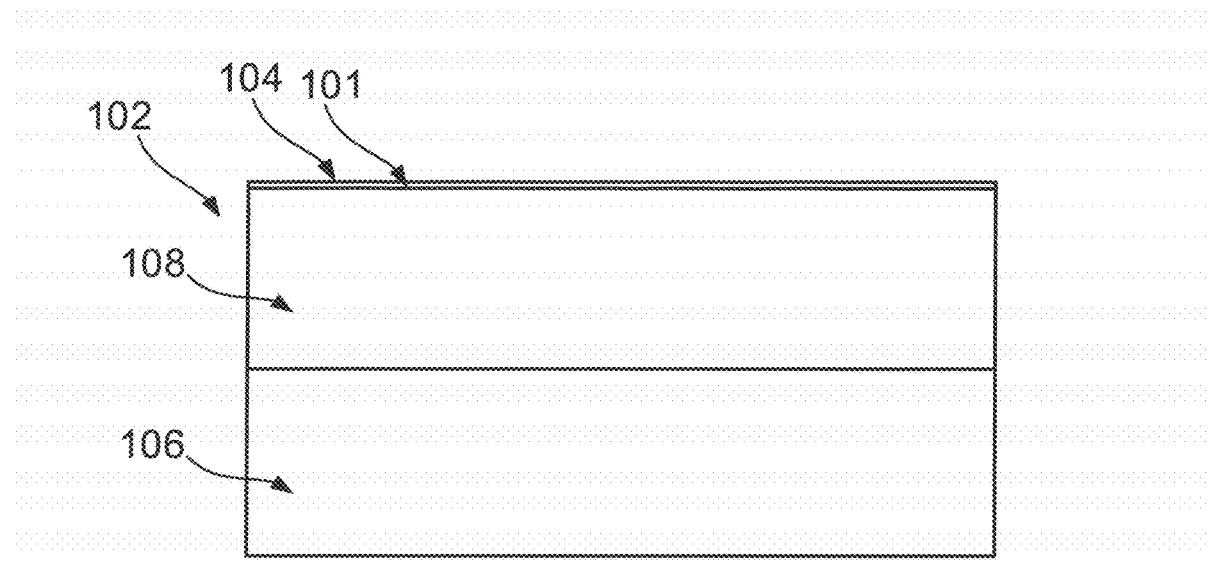
FIGS. 1A-1D show a method for making a field effect transistor of a semiconductor switch device according to an embodiment of the present disclosure.

In a first stage, shown in FIG. 1A, there is provided a semiconductor substrate 102. The substrate 102 may, for instance, comprise silicon. The substrate 102 has a major surface 101. The substrate 102 comprises a first semiconductor region 108 having a first conductivity type located adjacent the major surface 101. In this example, the first conductivity type is n-type, although is it envisaged that the first conductivity type may be p-type.

Where the first conductivity type is n-type, the first semiconductor region 108 may be doped with Arsenic, Phosphorus or Antimony. On the other hand, where the first conductivity type is p-type, the first semiconductor region 108 may be doped with Boron or Indium.

In this example, the first semiconductor region 108 comprises a doped epitaxial silicon layer located on an underlying part 106 (e.g. the bulk) of the substrate 102. The thickness of the epitaxial layer forming the first semiconductor region 108 may be around 0.1-1 µm. The underlying part 106 may be have a second conductivity type, that is a different conductivity type to the first conductivity type of the first semiconductor region 108. Where the second conductivity type is p-type, underlying part 106 may be doped with Boron. On the other hand, where the second conductivity type is n-type, the underlying part 106 may be doped with Arsenic. In the present example, the underlying part 106 comprises p-type doped silicon.

As shown in FIG. 1A, a dielectric layer 104 is deposited on the major surface 101 of the semiconductor substrate 102. The dielectric layer 104 will subsequently be patterned to form a gate dielectric of the semiconductor switch device. The dielectric layer 104 may, for instance, comprise silicon oxide.

Figure 1B:
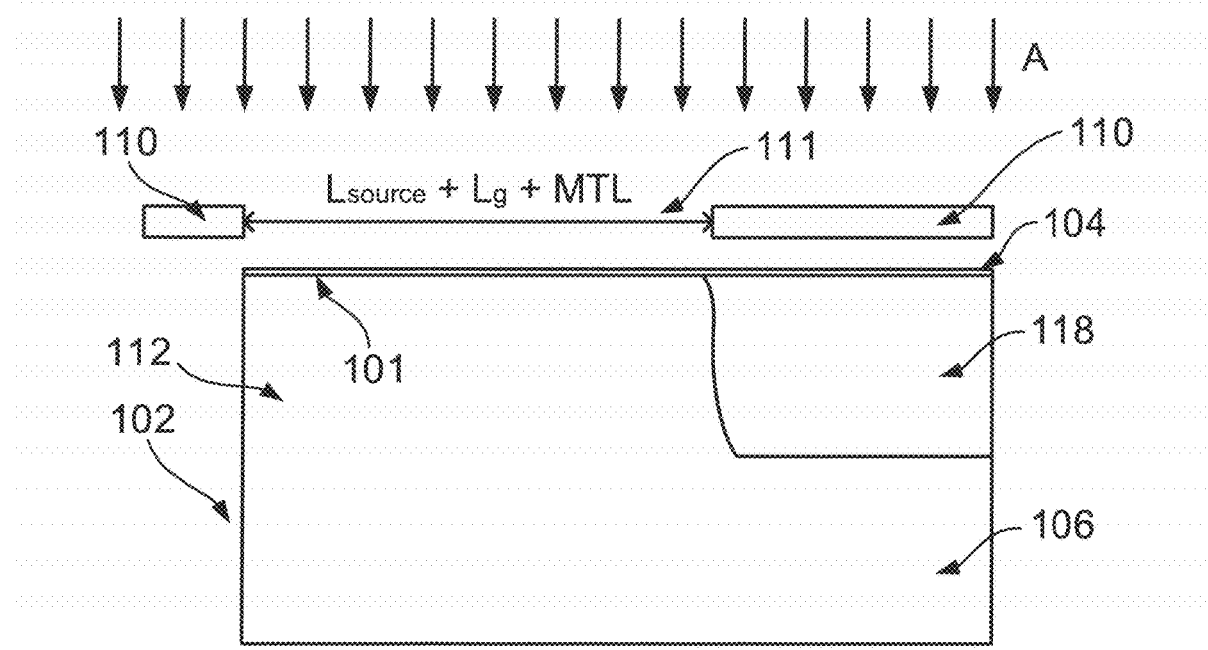

In a next stage shown in FIG. 1B, a number of ion implantation steps may be performed. Prior to implanting the ions, a mask 110 may be positioned over the major surface 101 of the semiconductor substrate 102. The mask 110 has an opening 111.

As shown in FIG. 1B, a lateral dimension of the opening 111 in the mask 110 is substantially equal to $L_{source}$+$L_g$+MTL, where $L_{source}$ is a length of the source region measured from an edge of the gate electrode on the first side of the gate electrode, where $L_g$ is a gate length of the semiconductor switch device, where MTL is a mask tolerance of the opening. It is envisaged that the mask tolerance MTL may be ≤400 nm. In a particular embodiment, the mask tolerance MTL may be in the range 0-200 nm. The gate length $L_g$ of a semiconductor switch device of the kind described herein may be less than 1 μm. To summarise, the lateral dimension of the opening 111 in the mask 110 is approximately equal to the length of the source $L_{source}$ plus the length of the gate $L_g$, allowing also for the mask tolerance of the opening 111 through which the ions are to be implanted as described below.

Having positioned the mask 110 over the major surface 101 of the semiconductor substrate 102, ions are implanted into the first semiconductor region through the opening 111. The implantation ions a represented by the arrows labelled A in FIG. 1B. As shown in FIG. 1B, the implanted ions form a well region 112 located in the first semiconductor region 108. A remaining part 118 of the first semiconductor region 108, located adjacent the well region 112 shown in FIGS. 1B-1D will accommodate the drain region of the device, to be described below. The well region 112 will contain a channel region of the field effect transistor forming the semiconductor switch device. The well region 112 will also contain the source region of the device, to be described below. Because the drain region will be located outside the well region 112, the drain-to-bulk parasitic junction capacitance ($C_{db}$) and, therefore, the off-state capacitance ($C_{off}$) of the device may be relatively low, owing to the reduced amount of impurity doping that occurs in the vicinity of the drain region.

The well region 112 has the second conductivity type, which as noted above is different to the first conductivity type. Accordingly, in the present example, the well region 112 is p-type, for forming an NMOS device. In examples in which the second conductivity type is n-type, the well region 112 may accordingly be n-type, for forming a PMOS device.

Where the first conductivity type is n-type, the ions implanted for forming the well region 112 may, for instance comprise Boron ions. An implantation energy of the ions implanted for forming the well region 112 may be in the range 50 keV-4 MeV, or more typically in the range of 100-300 keV. A peak concentration of the implanted ions of the implant for forming the well region 112 may be at a depth of around 0.1-2 μm beneath the major surface 101 of the semiconductor substrate 102. An implantation dose of the implant for forming the well region 112 may be in the range $10^{11}$-$10^{14}$ cm$^{-2}$.

On the other hand, where the first conductivity type is p-type, the ions implanted for forming the well region 112 may, for instance comprise Phosphorus (or Arsenic) ions. An implantation energy of the ions implanted for forming the well region 112 may be in the range 100 keV-1 MeV. A peak concentration of the implanted ions of the implant for forming the well region 112 may be at a depth of around 0.1-2 μm μm beneath the major surface 101 of the semiconductor substrate 102. An implantation dose of the implant for forming the well region 112 may be in the range $10^{11}$-$10^{14}$ cm$^{-2}$.

The well region 112 formed by the implant may extend completely through the first semiconductor region 108. As shown in FIG. 1B, the well region 112 may extend partially into the underling part 106 of the substrate 102. The well region 112 and the underlying part 106 of the semiconductor substrate 102 typically have the same conductivity type (i.e. the second conductivity type), which in the present example is p-type.

In addition to implanting ions for forming the well region 112, one or more other implants may be performed.

For instance, in one example, ions may be implanted through the opening 111 in the mask 110 positioned over the first semiconductor region of the semiconductor substrate 102, thereby to adjust a threshold voltage of the semiconductor switch device (this may be referred to as a DVt implant).

For an NMOS device (i.e. the first conductivity type is n-type, the second conductivity type is p-type), the ions implanted for adjusting a threshold voltage of the semiconductor switch device may, for instance, comprise Boron or Indium. An implantation energy of the ions implanted for adjusting the threshold voltage may be in the range 5-100 keV. A peak concentration of the implanted ions of the implant for adjusting the threshold voltage may be at a depth of around 10-100 nm beneath the major surface 101 of the semiconductor substrate 102. An implantation dose of the implant for adjusting the threshold voltage may be in the range $10^{11}$-$10^{14}$ cm$^{-2}$.

On the other hand, for a PMOS device (i.e. the first conductivity type is p-type, the second conductivity type is n-type), the ions implanted for adjusting a threshold voltage of the semiconductor switch device may, for instance, comprise Arsenic, Phosphorus or Antimony. An implantation energy of the ions implanted for adjusting the threshold voltage may be in the range 5-200 keV. A peak concentration of the implanted ions of the implant for adjusting the threshold voltage may be at a depth of around 10-100 nm beneath the major surface 101 of the semiconductor substrate 102. An implantation dose of the implant for adjusting the threshold voltage may be in the range $10^{11}$-$10^{14}$ cm$^{-2}$.

In another example, ions may be implanted through the opening 111 in the mask 110 positioned over the first semiconductor region of the semiconductor substrate 102, thereby to inhibit punch-through in the semiconductor switch device (this may be referred to as an anti-punch-through, or "APT" implant).

For an NMOS device (i.e. the first conductivity type is n-type, the second conductivity type is p-type), the ions implanted for inhibiting punch-through in the semiconductor switch device may, for instance, comprise Boron. An implantation energy of the ions implanted for inhibiting punch-through may be in the range 10-200 keV. A peak concentration of the implanted ions of the implant for inhibiting punch-through may be at a depth of around 0.1-2 μm beneath the major surface 101 of the semiconductor substrate 102. An implantation dose of the implant for inhibiting punch-through may be in the range $10^{11}$-$10^{14}$ cm$^{-2}$.

On the other hand, for a PMOS device (i.e. the first conductivity type is p-type, the second conductivity type is n-type), the ions implanted for inhibiting punch-through in the semiconductor switch device may, for instance, comprise Phosphorus. An implantation energy of the ions implanted for inhibiting punch-through may be in the range 50-200 keV. A peak concentration of the implanted ions of the implant for inhibiting punch-through may be at a depth of around 0.1-2 μm beneath the major surface 101 of the semiconductor substrate 102. An implantation dose of the implant for inhibiting punch-through may be in the range $10^{11}$-$10^{14}$ cm$^{-2}$.

Note that the mask 110 may prevent ions associated with the DVt and/or the APT implant reaching the remaining part 118 of the first semiconductor region 108, in which the drain region of the device is to be formed, as described below. Instead, these ions may only be implanted into the well region 112, which will subsequently accommodate the source region and channel region of the device. The use of the mask 110 can again therefore reduce the impurity doping concentration in the drain region, which may allow the drain-to-bulk parasitic junction capacitance ($C_{db}$) and, therefore, the off-state capacitance ($C_{off}$) of the device to be relatively low.

Figure 1C:
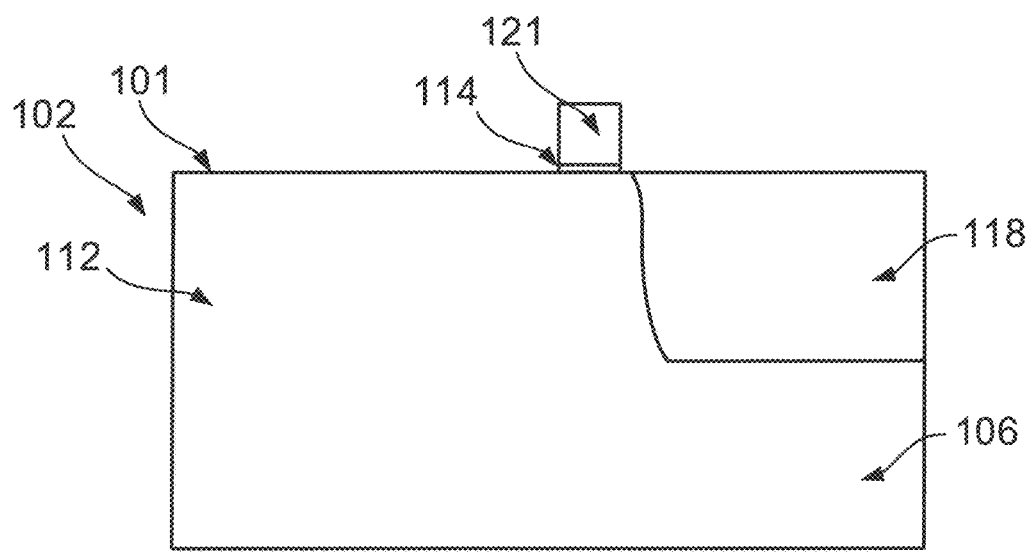

In a next stage shown in FIG. 1C, following removal of the mask 110, a gate of the field effect transistor may be formed. This may be achieved by depositing a gate electrode material (e.g. doped polysilicon) over the dielectric layer 104, and then patterning the gate electrode material and the dielectric layer 104 to reach the arrangement shown in FIG. 1C. The gate may include a gate electrode 121 located on a remaining part 114 of the aforementioned dielectric layer 104. As discussed above, the gate has a gate length $L_g$. The gate is located directly above the well region 112. Note that since the opening 111 in the mask 110 described above had a lateral dimension given by $L_{source}+L_g+MTL$, the source together with the gate may be approximately the same size (laterally) as the well region 112, at least at positions close to the major surface 101 of the semiconductor substrate 102.

As can be seen in FIG. 1C, the gate electrode 121 may be located toward one side of the well region 112 when viewed from above the major surface of the semiconductor substrate 102. This can allow the drain region, which will be located in the remaining part 118 of the first semiconductor region 108, to be positioned adjacent the gate. In one example, an edge of the gate electrode 121 (located on the side of the gate electrode occupied by the drain region) may be located directly above an edge of the well region 112. An example of this can be seen in FIG. 1D, in which an edge of the gate electrode 121 is located directly above the interface between the well region 112 and the edge of the drain region 140 (in particular, above the LDD region 142 of the drain region 140).

Figure 1D:
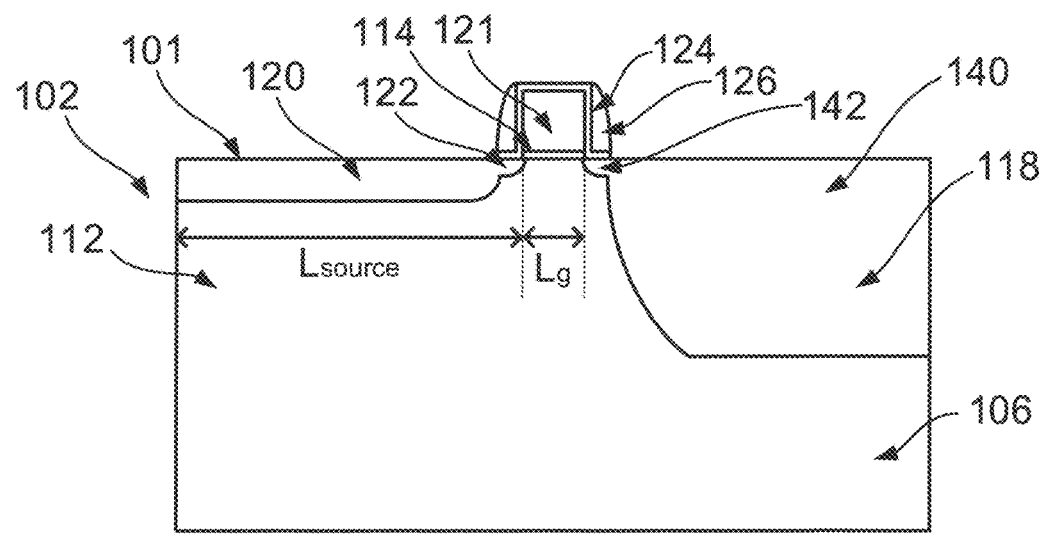

In a next stage shown in FIG. 1D, the gate may be provided with sidewall spacers 126. As is known in the art, a layer 124 comprising Silicon Oxide may be deposited over the gate electrode prior to the formation of the spacers 126. The layer 124 may cover at least the sidewalls of the gate electrode. The spacers 126 may partially mask the parts of the substrate 102 located immediately on either side of the gate, during formation of the source and drain regions to be described below.

Following the optional formation of the spacers 126, a source region 120 and drain region 140 of the device may be formed on either side of the gate electrode 121 using ion implantation. As can be seen in FIG. 1D, the source region 120 is located in the well region 112, on a first side of the gate electrode 121, while the drain region 140 is located in the remaining part 118 of the first semiconductor region 108 on a second side of the gate electrode 121 (the second side being opposite the first side). Note that the drain region 140 and the remaining part 118 of the first semiconductor region 108 have the same conductivity type. The dopants contained in the remaining part 118 of the first semiconductor region 108 may thus contribute to the formation of the drain region 140. The source region 120 and drain region 140 are both of the first conductivity type (n-type in the present example). For an NMOS device (i.e. the first conductivity type is n-type, the second conductivity type is p-type), the ions implanted for forming the source and drain regions may, for instance, comprise Arsenic, Phosphorus (or Antimony). On the other hand, for a PMOS device (i.e. the first conductivity type is p-type, the second conductivity type is n-type), the ions implanted for forming the source and drain regions may, for instance, comprise Boron (or Indium).

It is also envisaged that LDD regions 122, 142 of the first conductivity type may be formed beneath the spacers 126 using ion implantation. These LDD regions 122, 142 are generally lightly doped compared to the source and drain regions 120, 140 themselves, and the implants used to form them may be shallower than those used to form the source and drain regions 120, 140. The same kinds of ions may be used to form the LDD regions 122, 142 as those mentioned above for forming the source and drain regions 120, 140. As can be seen in FIG. 1D, the LDD regions 122, 142 may extend from the edges of the source and drain regions 120, 140, in toward the channel region of the device.

FIG. 1D also shows the lateral dimensions of the source ($L_{source}$) and the gate ($L_g$). As will be appreciated by those skilled in the art, these lengths are typically measured in a direction parallel to the general direction of the flow of charge carriers in the channel region of the device.

With reference to FIGS. 1B and 1D, it will be appreciated that the use of the mask 110 during the implantation steps for forming the well region 112, for adjusting the threshold voltage and for inhibiting punch-through can prevent the ions associated with these implants entering the parts of the first semiconductor region 108 which will subsequently be occupied by the drain region 140. This may allow the drain-to-bulk parasitic junction capacitance ($C_{db}$) and, therefore, the off-state capacitance ($C_{off}$) of the device to be relatively low, owing to the reduced amount of impurity doping that occurs in the vicinity of the drain region 140.

Figure 2:
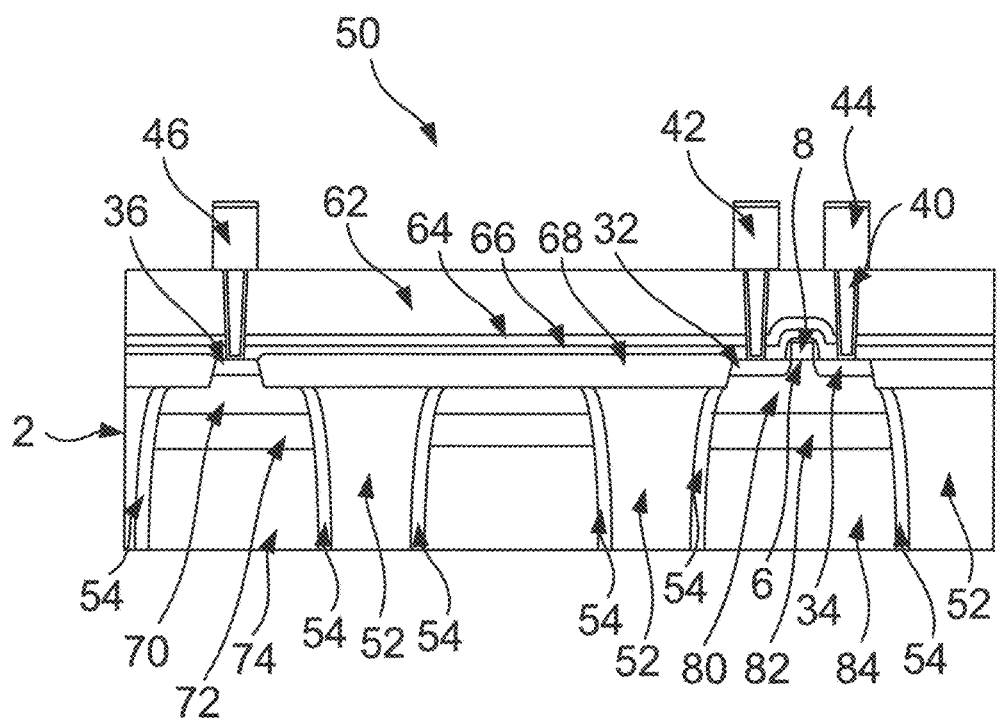
FIG. 2 shows a semiconductor switch device according to an embodiment of the present disclosure.

FIG. 2 shows a semiconductor switch device 50 according to an embodiment of the present disclosure. The device 50 in this example is an NMOS switch device for use in RF applications. The device 50 includes a MOS field effect transistor comprising a source region 32, drain region 34, gate electrode 8, gate dielectric 6. The device also includes a body contact 36. The source region 32, drain region 34 and body contact 36 may be provided with electrical contacts 42, 44, 46, respectively (as is the gate electrode 8, although this is not shown in FIG. 2). These electrical contacts 42, 44, 46 may be connected to the source region 32, drain region 34 and body contact 36 by electrically conductive members 40 extending through one or more inter metal dielectric layers 62, 64, 66 (for example silicon oxide and silicon nitride) located provided on a major surface of the substrate 2.

The source region 32 and drain region 34 in this example are located in a p-type well 80. The body contact 36 is located in another p-type well 70. Isolations regions 68 (such as shallow trench isolation (STI)) may be used to isolate the features located in the different wells. In this example, an optional buried p+ layer 82 may be located beneath the p-type well 80, and an optional buried p+ layer 72 may be located beneath the p-type well 70. Each well and buried p+ layer is connected through the underlying parts 74, 84 of the substrate 2, which may be p− doped. The wells 70, 80 and buried layers 72, 82 may also be separated by deep trench isolation 52 (DTI). The sidewalls of the DTI may be lined with one or more dielectric layers 54, such as silicon oxide.

The p-type well 80, source region 32, drain region 34 and gate of the device 50 shown in FIG. 2 may be formed using the method described herein (e.g. the method of FIG. 1A).

Figure 3:
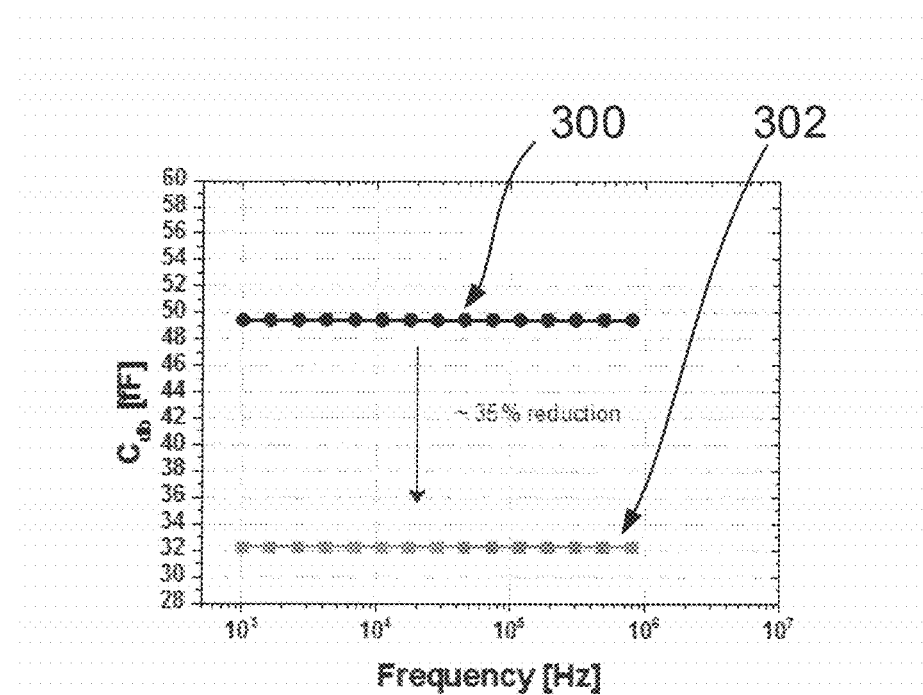
FIG. 3 compares the simulated drain-to-bulk parasitic junction capacitance ($C_{db}$) as a function of frequency, in the low-frequency limit, of a conventional field effect transistor with that of a field effect transistor made using a method of the kind shown in FIGS. 1A-1D.

FIG. 3 compares the simulated drain-to-bulk parasitic junction capacitance ($C_{db}$) as a function of frequency, in the low-frequency limit, of a conventional field effect transistor (plot 300) with that of a field effect transistor made using a method of the kind shown in FIGS. 1A-1D (plot 302). As can be seen from FIG. 3, an embodiment of this disclosure may produce an approximately 35% reduction in drain-to-bulk parasitic junction capacitance compared to a conventional NMOS field effect transistor.

Figure 4:
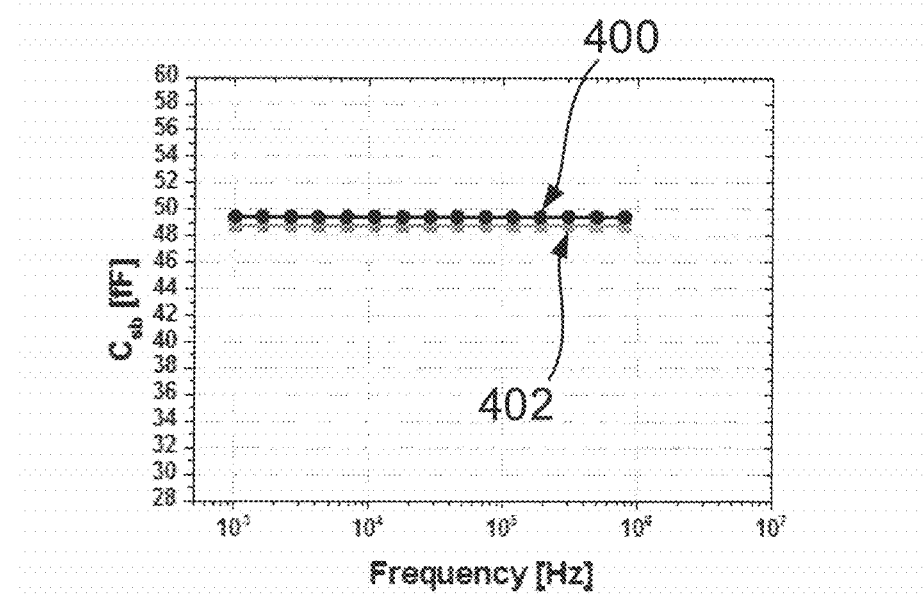
FIG. 4 compares the simulated source-to-bulk parasitic junction capacitance ($C_{sb}$) as a function of frequency, in the low-frequency limit, of a conventional field effect transistor with that of a field effect transistor made using a method of the kind shown in FIGS. 1A-1D.

FIG. 4 compares the simulated source-to-bulk parasitic junction capacitance ($C_{sb}$) as a function of frequency, in the low-frequency limit, of a conventional field effect transistor (plot 400) with that of a field effect transistor made using a method of the kind shown in FIGS. 1A-1D (plot 402). As can be seen from FIG. 4, the source-to-bulk parasitic junction capacitance ($C_{sb}$) of both devices is similar.

Figure 5:
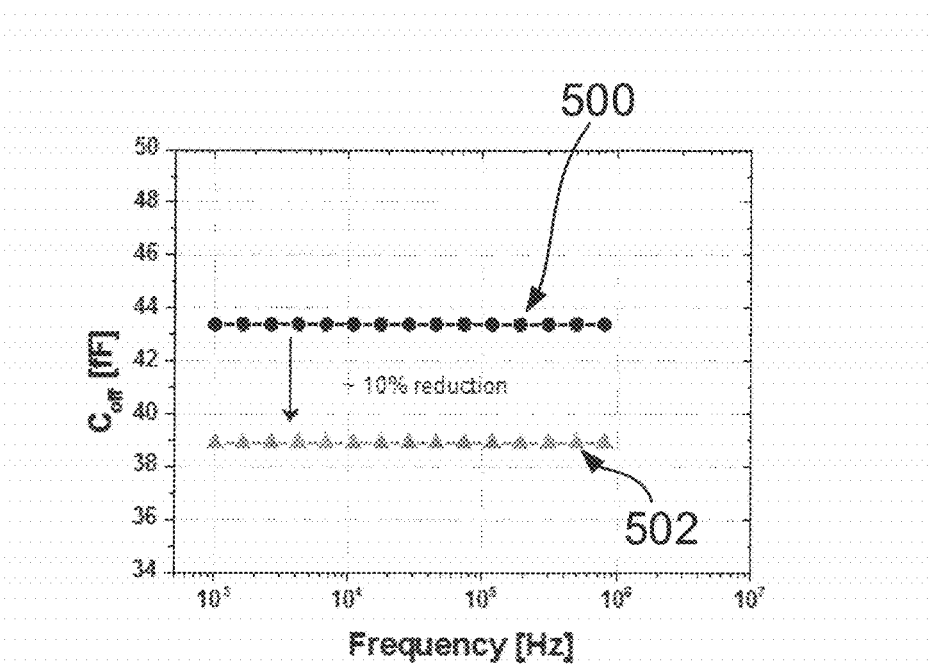
FIG. 5 compares the simulated off-state capacitance ($C_{off}$) as a function of frequency, in the low-frequency limit, of a conventional field effect transistor with that of a field effect transistor made using a method of the kind shown in FIGS. 1A-1D.

FIG. 5 compares the simulated off-state capacitance ($C_{off}$) as a function of frequency, in the low-frequency limit, of a conventional field effect transistor (plot 500) with that of a field effect transistor made using a method of the kind shown in FIGS. 1A-1D (plot 502). As can be seen from FIG. 5, an embodiment of this disclosure may produce an approximately 10% reduction in off-state capacitance compared to a conventional NMOS field effect transistor.

Figure 6:
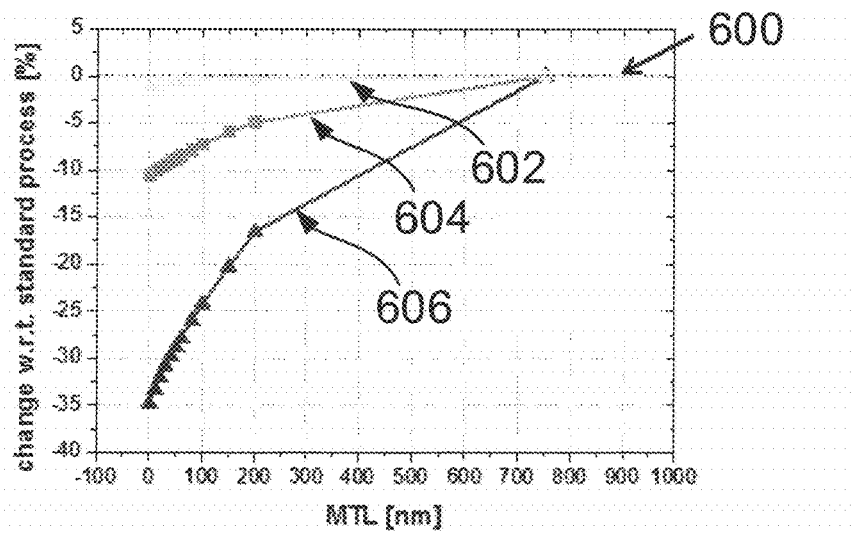
FIG. 6 shows the impact of mask tolerance MTL (i.e. total mask opening=$L_{source}$+$L_g$+MTL) on the source-to-bulk parasitic junction capacitance ($C_{sb}$), the drain-to-bulk parasitic junction capacitance ($C_{db}$), and the off-state capacitance ($C_{off}$) for a semiconductor switch device according to an embodiment of the present disclosure.

FIG. 6 shows the impact of mask tolerance MTL (i.e. total mask opening=$L_{source}$ $L_g$+MTL) on the source-to-bulk parasitic junction capacitance ($C_{sb}$), the drain-to-bulk parasitic junction capacitance ($C_{db}$), and the off-state capacitance ($C_{off}$) for a semiconductor switch device according to an embodiment of the present disclosure. In FIG. 6, the baseline 600 corresponds to a conventional NMOS field effect transistor, while:

- the plot 602 corresponds to the source-to-bulk parasitic junction capacitance ($C_{sb}$) of an NMOS field effect transistor made using a method of the kind described in relation to FIGS. 1A-1D;
- the plot 604 corresponds to the drain-to-bulk parasitic junction capacitance ($C_{db}$) of an NMOS field effect transistor made using a method of the kind described in relation to FIGS. 1A-1D; and
- the plot 606 corresponds to the off-state capacitance ($C_{off}$) of an NMOS field effect transistor made using a method of the kind described in relation to FIGS. 1A-1D.

The vertical axis in FIG. 6 indicates the percentage change in $C_{sb}$, $C_{db}$ and $C_{off}$ as a function of MTL, compared to the conventional device. As can be seen in FIG. 6, reductions in $C_{db}$ and $C_{off}$ may be achieved across a range of values of MTL, and the largest gains are typically made at smaller mask tolerances.

Accordingly, there has been described a semiconductor switch device and a method of making the same. The method includes providing a semiconductor substrate having a major surface and a first semiconductor region having a first conductivity type. The method further includes implanting ions into the first semiconductor region through an opening in a mask positioned over the first semiconductor region, thereby to form a well region located in the first semiconductor region, the well region having a second conductivity type different to the first conductivity type. The method also includes depositing and patterning a gate electrode material on a gate dielectric to form a gate electrode located directly above the well region. The method further includes performing ion implantation to form a source region located in the well region on a first side of the gate, and to form a drain region located outside the well region on a second side of the gate.

Although particular embodiments of this disclosure have been described, it will be appreciated that many modifications/additions and/or substitutions may be made within the scope of the claims.

The invention claimed is:

1. A method of making a semiconductor switch device, the method comprising:
   providing a semiconductor substrate having:
      a major surface; and
      a first semiconductor region having a first conductivity type located adjacent the major surface;
   depositing a gate dielectric on the major surface of the substrate;
   implanting ions into the first semiconductor region through an opening in a mask positioned over the first semiconductor region, thereby to form a well region located in the first semiconductor region, the well region having a second conductivity type different to the first conductivity type;
   depositing and patterning a gate electrode material on the gate dielectric to form a gate electrode located directly above the well region; and
   performing ion implantation to:
      form a source region having said first conductivity type located in the well region on a first side of the gate electrode, and
      form a drain region having said first conductivity type located outside the well region on a second side of the gate electrode;
   wherein a lateral dimension of the opening in the mask is substantially equal to $L_{source}$+$L_g$+MTL;
   wherein $L_{source}$ is a length of the source region measured from an edge of the gate electrode on the first side of the gate electrode;
   wherein $L_g$ is a gate length of the semiconductor switch device; and
   wherein MTL is a mask tolerance of the opening, and wherein MTL≤400 nm.

2. The method of claim 1,
   wherein the gate electrode is located toward one side of the well region when viewed from above the major surface of the semiconductor substrate.

3. The method of claim 2,
   wherein the drain region is located adjacent the side of the well region toward which the gate electrode is located.

4. The method of claim 1,
   wherein an edge of the gate electrode located on said second side of the gate electrode is located directly above an edge of the well region.

5. The method of claim 1,
   wherein the mask tolerance MTL is in the range 0-200 nm.

6. The method of claim 5,
   wherein the gate length $L_g$ is less than 1 μm.

7. The method of claim 1, further comprising
   implanting ions into the first semiconductor region through the opening in the mask positioned over the first semiconductor region,
   thereby to adjust a threshold voltage of the semiconductor switch device.

8. The method of claim 1, further comprising
   implanting ions into the first semiconductor region through the opening in the mask positioned over the first semiconductor region,
   thereby to inhibit punch-through in the semiconductor switch device.

9. The method of claim 1, comprising
   forming spacers on opposed sidewalls of the gate electrode prior to said performing ion implantation to form the source region and the drain region.

10. The method of claim 1,
    wherein the first conductivity type is n-type and wherein the second conductivity type is p-type.

11. The method of claim 1,
    wherein the first semiconductor region comprises a doped epitaxial layer.

12. The method of claim 1, wherein the switch device is a Radio Frequency (RF) switch device.

* * * * *